United States Patent
Yasue et al.

(10) Patent No.: US 9,466,454 B2
(45) Date of Patent: Oct. 11, 2016

(54) SPIN ROTATION DEVICE

(75) Inventors: Tuneo Yasue, Hirakata (JP); Takanori Kosikawa, Nara (JP); Katsusige Tuno, Akisima (JP)

(73) Assignee: SANYU DENSHI CO., LTD., Tokyo (JP)

( * ) Notice: Subject to any disclaimer, the term of this patent is extended or adjusted under 35 U.S.C. 154(b) by 430 days.

(21) Appl. No.: 14/127,111

(22) PCT Filed: Jun. 4, 2012

(86) PCT No.: PCT/JP2012/064362
§ 371 (c)(1),
(2), (4) Date: Mar. 10, 2014

(87) PCT Pub. No.: WO2012/173007
PCT Pub. Date: Dec. 20, 2012

(65) Prior Publication Data
US 2014/0197734 A1 Jul. 17, 2014

(30) Foreign Application Priority Data
Jun. 17, 2011 (JP) .................................. 2011-135054

(51) Int. Cl.
*H01J 3/22* (2006.01)
*H01J 1/50* (2006.01)
(Continued)

(52) U.S. Cl.
CPC .. *H01J 1/50* (2013.01); *H01J 3/22* (2013.01); *H01J 37/145* (2013.01); *H01J 37/26* (2013.01); *H01J 2237/041* (2013.01); *H01J 2237/1505* (2013.01)

(58) Field of Classification Search
USPC .................................................. 315/111.81
See application file for complete search history.

(56) References Cited

U.S. PATENT DOCUMENTS 5,444,243 A * 8/1995 Kohhashi ............... H01J 37/05
250/305
7,488,960 B2 * 2/2009 Zani ....................... B82Y 10/00
216/66
(Continued)

FOREIGN PATENT DOCUMENTS

JP 58-193500 11/1983
JP 2007-149495 6/2007
(Continued)

OTHER PUBLICATIONS

PCT International Preliminary Report on Patentability issued Dec. 17, 2013 in corresponding International Application No. PCT/JP2012/064362.

Primary Examiner — Douglas W Owens
Assistant Examiner — Srinivas Sathiraju
(74) Attorney, Agent, or Firm — Staas & Halsey LLP

(57) ABSTRACT

A spin device includes: a first condenser lens which focuses a spin polarized electron beam discharged from an electron gun or reflected on a sample; a spin rotator which includes a multipole having a point to which the electron beam is focused by the first condenser lens at a lens center or in the vicinity of the lens center and being capable of generating an electric field and a magnetic field; a Wien condition generating means which applies a voltage and a current which satisfy the Wien condition for rotating spin of the electron beam by a designated angle and making the electron beam advance straightly to the multipole which constitutes the spin rotator; and a second condenser lens which focuses the electron beam whose spin is rotated by the spin rotator.

21 Claims, 16 Drawing Sheets

(51) Int. Cl.
*H01J 37/145* (2006.01)
*H01J 37/26* (2006.01)

(56) References Cited

U.S. PATENT DOCUMENTS

| | | | | |
|---|---|---|---|---|
| 7,495,242 B2* | 2/2009 | Zani | ............ | B82Y 10/00 204/192.11 |
| 7,641,151 B2* | 1/2010 | Janhunen | ............ | B64G 1/222 244/158.2 |
| 7,659,526 B2* | 2/2010 | Zani | ............ | B82Y 10/00 250/309 |
| 7,737,397 B2* | 6/2010 | Morrisroe | ............ | F23C 99/003 250/281 |
| 7,746,421 B2* | 6/2010 | Takahashi | ............ | G02B 5/3016 349/62 |
| 8,658,994 B2* | 2/2014 | Zani | ............ | B82Y 10/00 250/492.22 |
| 2005/0098742 A1* | 5/2005 | Kellerman | ............ | H01J 37/321 250/492.21 |
| 2007/0045534 A1* | 3/2007 | Zani | ............ | B82Y 10/00 250/309 |
| 2007/0284538 A1* | 12/2007 | Zani | ............ | B82Y 10/00 250/398 |
| 2007/0284695 A1* | 12/2007 | Zani | ............ | B82Y 10/00 257/607 |
| 2010/0098922 A1* | 4/2010 | Zani | ............ | B82Y 10/00 428/206 |
| 2012/0112323 A1* | 5/2012 | Zani | ............ | B82Y 10/00 257/618 |

FOREIGN PATENT DOCUMENTS

| | | |
|---|---|---|
| JP | 2007-299604 | 11/2007 |
| JP | 2009-43533 | 2/2009 |
| JP | 2010-3450 | 1/2010 |

\* cited by examiner

FIG. 2
(a)
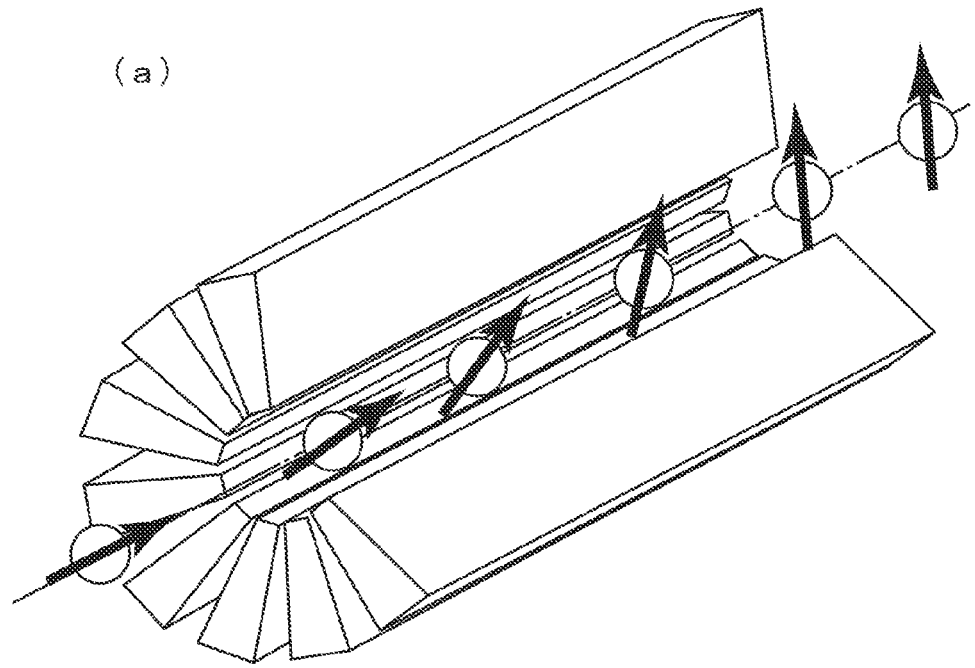
(b)
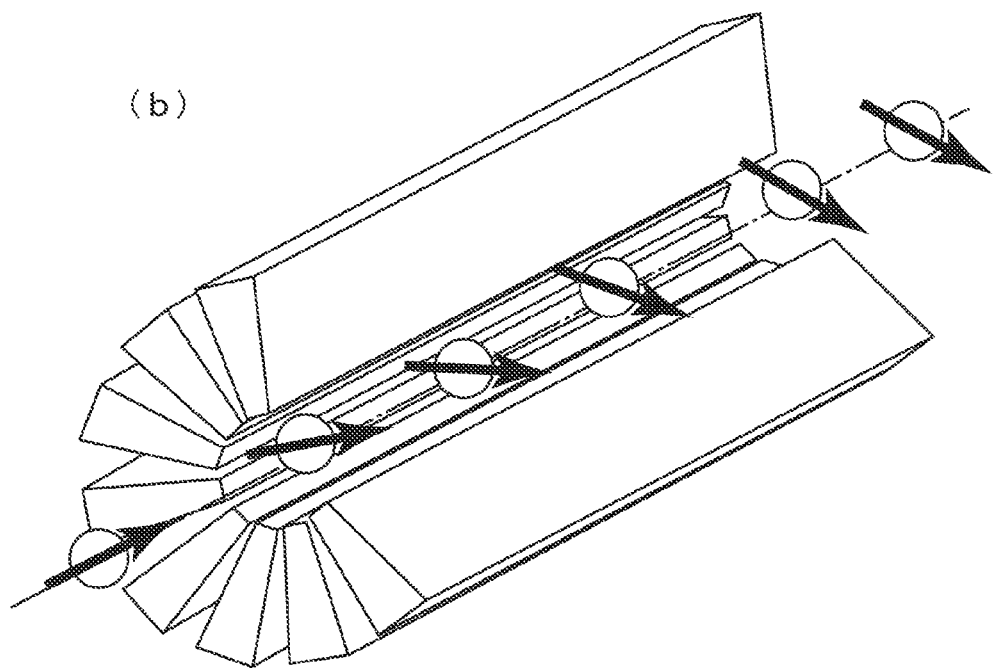

Fig. 4

|   | sin-cosine method | | vector method | | | |
|---|---|---|---|---|---|---|
|   | 0° | 45° | X | Y | X+Y | (X+Y)/√2 |
| 1 | 0.9239 | 0.9239 | 1 | 0.41421 | 1.4142 | 1 |
| 2 | 0.3827 | 0.9239 | 0.4142 | 1 | 1.4142 | 1 |
| 3 | −0.3827 | 0.3827 | −0.4142 | 1 | 0.5858 | 0.4142 |
| 4 | −0.9239 | −0.3827 | −1 | 0.4142 | −0.5858 | −0.4142 |
| 5 | −0.9239 | −0.9239 | −1 | −0.4142 | −1.4142 | −1 |
| 6 | −0.3827 | −0.9239 | −0.4142 | −1 | −1.4142 | −1 |
| 7 | 0.3827 | −0.3827 | 0.4142 | −1 | −0.5858 | −0.4142 |
| 8 | 0.9239 | 0.3827 | 1 | −0.4142 | 0.5858 | 0.4142 |

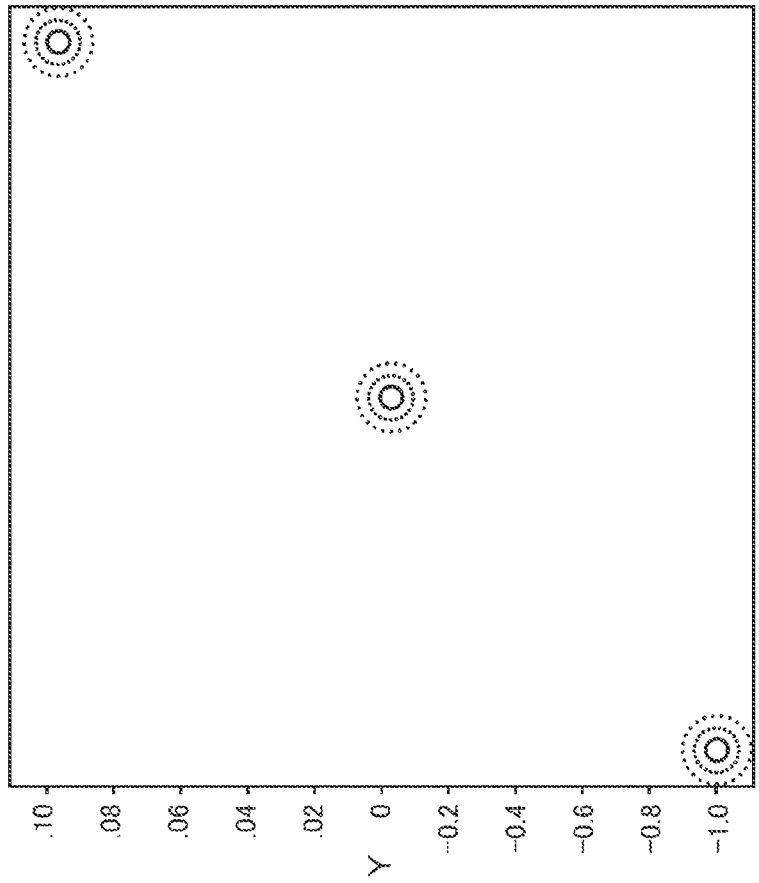
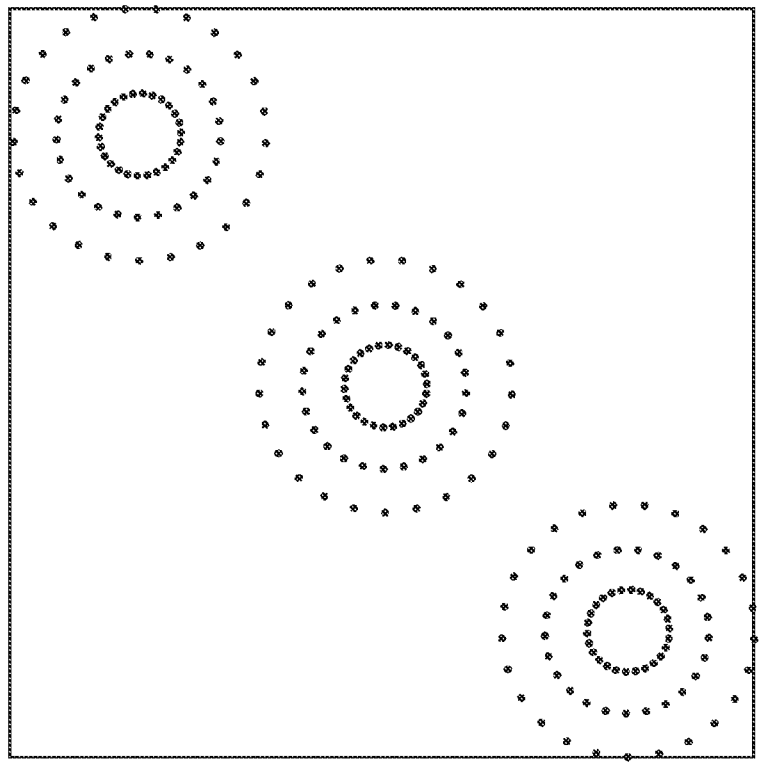
Fig. 8

PRIOR ART
Fig.13
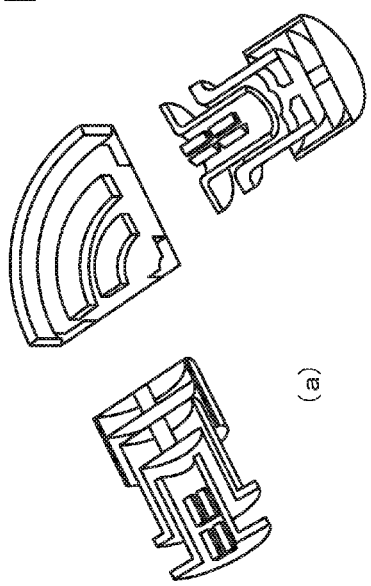
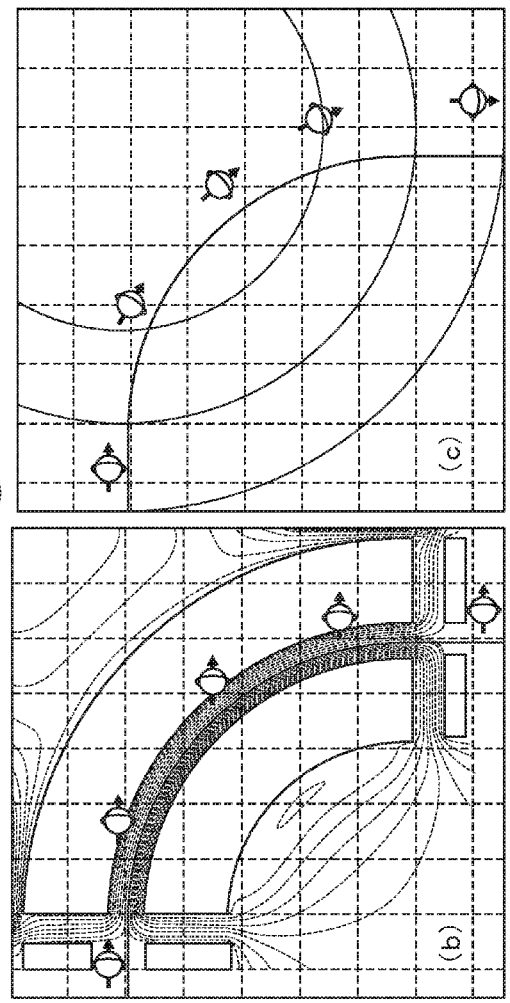

PRIOR ART

SPIN ROTATION DEVICE

TECHNICAL FIELD

The present invention relates to a spin rotation device which is used for inputting an electron emitted from an electron gun for emitting a spin polarized electron, a spin polarized reflection electron from a magnetic body sample, a spin polarized electron emitted from a surface of a topological insulating body or the like into a Mott detector in a state where the direction of the spin of the electron is aligned with the advancing direction of the electron or the direction of the spin of the electron is aligned with the direction of the magnetization of a magnetic body for observation of the magnetic domain structure of the magnetic body.

BACKGROUND ART

Conventionally, assuming the advancing direction of an electron as a Z axis, it is necessary for a spin rotator to include two kinds of mechanisms consisting of a mechanism which rotates the electron in a plane including the Z axis and a mechanism which rotates the electron in a XY plane perpendicular to the plane including the Z axis. With respect to the latter mechanism, although there may be a case where a mechanism which mechanically rotates a sample or a detector is provided, as a method which rotates an electron electromagnetically, a method which uses an axis-symmetric magnetic field lens proposed by Duden et al. and is disclosed in non-patent literature 1 has been used most popularly.

Hereinafter, the method is explained in detail in conjunction with explanatory views of the prior art shown in FIG. 12 to FIG. 16.

FIG. 12 is a view which is prepared by writing a magnetic potential distribution in a cross-sectional view of such a spin rotator, wherein a trajectory of an electron beam incident on the spin rotator is shown together with condenser lens systems (CL2, CL3) arranged behind the spin rotator.

As a spin rotator which rotates an electron beam in a plane which includes a Z axis, there has been known a device as disclosed in a paper written by Duden et al. introduced previously where a 90° electric field deflector and a 90° magnetic deflector overlap with each other. FIG. 13(a) shows a 90° deflection-type spin rotation mechanism constructed based on the substantially same principle as the spin rotator shown in FIG. 12 together with round lens systems arranged in front of and behind the spin rotation mechanism. When the direction of spin is equal to the advancing direction of an electron, by performing the 90° deflection using only an electric field, as shown in FIG. 13(b), the advancing direction of an electron is rotated by 90° although the direction of spin of a discharged beam is not changed and hence, the direction of spin has the inclination of 90° with respect to the advancing direction of an electron. When the 90° deflection of the electron beam is performed using only a magnetic field, the spin is rotated along with the rotation of an electron as shown in FIG. 13(c) and hence, the direction of spin is equal to the advancing direction of the electron even after the 90° deflection. By realizing the 90° rotation by simultaneously applying an electric field and a magnetic field to the electron beam, the direction of spin can take an intermediate value between 0° and 90°.

In the case of the device of the above-mentioned type, it is always necessary to rotate an electron beam by 90°. Depending on the device, however, there is a case where this rotation by 90° is not so desirable. That is, there is a case where it is desirable to rotate only the spin while keeping the advancing direction of an electron straight. To satisfy such a request, there has been known a method which uses a Wien filter as disclosed in non-patent literature 2.

FIG. 14 shows one example of a spin rotator of a Wien filter type where the spin rotator is sandwiched between round lenses. FIG. 14 also shows a case where the simulation of a trajectory of an electron is performed in a state where an electric field and a magnetic field of the Wien filter are turned off and a case where the simulation of a trajectory of an electron is performed under a condition that spin is rotated by 90°.

The Wien filter adopts the same principle as a spin rotator of a 90° deflection type and hence, an electric field and a magnetic field are applied to an electron beam in an overlapping manner in the same manner as the spin rotator of a 90° deflection type. However, the Wien filter differs from the spin rotator of 90° deflection type with respect to a point that the direction of a voltage and the direction of a current are set such that the direction of deflection of an electron generated by an electric field and the direction of deflection of the electron generated by a magnetic field become opposite to each other. In the spin rotator of 90° deflection type, the direction of a voltage and the direction of a current are set such that the direction of the deflection of an electron generated by an electric field and the direction of the deflection of the electron generated by a magnetic field become the same.

In the Wien filter, the direction of deflection of an electron beam generated by an electric field and the direction of deflection of the electron beam generated by a magnetic field become opposite to each other and, at the same time, the magnitude of the electric field and the magnitude of the magnetic field are set such that the magnitude of deflection generated by the electric field and the magnitude of deflection generated by the magnetic field are always the same so that an electron beam advances straightly as a result. This condition for making an electron beam advance straightly is referred to as the Wien condition and the Wien condition is expressed by E1=vB1. E1, B1 and v are the magnitude of a uniform electric field, the magnitude of a uniform magnetic field and the velocity of an electron respectively. The spin is rotated only by the magnetic field and the magnitude of the rotation is expressed as follows.

Frequency of Larmor precession: $\omega = eB/m$

Rotational angle: $\alpha = L\omega/v = LeB1/mv$ L: length of filter

Here, to substitute the Wien condition E1=vB1 and the square of velocity $v^2 = 3eUo/m$ into $\alpha = L\omega/v = LeB1/mv$, the rotational angle $\alpha$ is expressed by a formula $\alpha = LE1/2Uo$.

To convert a value E1 of an electric field into an electric pole voltage V1 which generates the value E1 of an electric field, the electric pole voltage V1 is expressed by the following formula.

V1=E1R

R: radius of round hole at the center,

Assuming $\alpha = \pi/2(90°)$, Uo=20,000V, R=5 mm, L=80 mm, the electric pole voltage V1 is obtained as follows.

$V1 = 2 \times 20,000 \times 5\pi/2 \times 80 = 3926.69V$

A magnetic field is obtained based on the Wien condition described previously.

When the Wien filter is used, it is necessary to bring the magnitude of an electric field and the magnitude of a magnetic field into the relationship which always satisfies the Wien condition for making an electron beam advance straightly. Accordingly, to adjust the electron beam at various spin rotational angles, the technique that a spin rotational angle is set to a fixed value by combining an electric field and a magnetic field as in the case of the 90° deflector is not adopted. That is, a spin rotational angle is determined by adjusting a value of a magnetic field. In view of the above, as shown in FIG. 14, a lens condition on a preceding stage of the Wien filter is set such that an electron beam is focused on the center of the Wien filter. Due to such setting of the lens condition, as shown in the drawing on a lower side of FIG. 13, even after a case where spin is rotated by applying an electric field and a magnetic field to an electron beam, a lens condition on a succeeding stage of the Wien filter does not largely deviate and hence, the readjustment of a condenser lens system can be minimized and it is possible to rotate only the spin.

Non-patent Literature 1: T. Duden, E. Bauer, A compact electron-sipin-polarization manipulater, Rev. Sci. Instrum 66(4) 1995, 2861-2864

Non-patent Literature 2: T. Kohashi, M. Konoto, K. Kike J-Electorn Microscopy 59(1)(2010)43-52.

Non-patent Literature 3: T. T. tang, Optik 74 (1986) 51-56.

DISCLOSURE OF THE INVENTION

Technical Problem

As has been explained above, the rotation of spin requires two kinds of the rotation, that is, the rotation in a plane which includes the advancing direction Z of an electron beam and the rotation in an XY plane perpendicular to the plane. It is necessary to provide an auxiliary round lens for focusing an electron beam on center surfaces of respective devices in respective cases and hence, it is necessary to provide 4 kinds of optical elements consisting of a round lens, an in-plane rotator where the in-plane includes a Z axis, a round lens, and an XY in-plane rotator. The case where the spin rotation device includes a Wien-filter-type rotator is shown in FIG. 15, while a spin rotation system which includes a 90° deflection spin rotator and an in-plane rotator formed of a magnetic field type lens is shown in FIG. 16.

Besides these mechanisms, a condenser lens system required in an ordinary LEEM is necessary. In this manner, the electron beam irradiation system ranging from the electron gun to the sample via the beam separator has a drawback that the system becomes extremely large-sized.

In view of such circumstances, there has been a demand for making the whole irradiation system more compact by further simplifying the structure of a spin rotator.

Solution to Problem

To overcome these drawbacks, the present invention provides a spin rotation device which is configured to rotate a spin polarized electron beam which is discharged from an electron gun or is discharged from, is reflected on or is made to pass through a sample in the desired direction, wherein the spin rotation device includes: a first condenser lens which focuses the spin polarized electron beam which is discharged from the electron gun or is discharged from or is reflected on the sample; a spin rotator which includes a multipole having a point to which the electron beam is focused by the first condenser lens at a lens center or in the vicinity of the lens center and being capable of generating an electric field and a magnetic field; a Wien condition generating means which applies a voltage and a current expressed by following formulae which satisfy the Wien condition for rotating spin of the electron beam by a designated angle and making the electron beam advance straightly to the multipole which constitutes the spin rotator; and a second condenser lens which focuses the electron beam whose spin is rotated by the spin rotator.

$$V1(n)=V1\ \mathrm{Cos}(\theta 0+n\theta+\alpha)$$

$$N1(n)=N1\ \mathrm{Sin}(\theta 0+n\theta+\alpha)$$

Here, n is the number of the pole, V1(n) and N1(n) are a voltage and a current of n-th pole, V1 and N1 are a voltage and a current of a uniform field which satisfies the Wien condition, θ0 is an angle of the first pole from the horizontal direction, θ is an angle determined based on the number of poles of the multipole and is obtained as 360°/number of poles, and α indicates the direction of spin.

Here, the number of poles of the multipole is set to a value which is integer times as large as 4.

At least one of a quadrupole electric field and a quadrupole magnetic field which corrects astigmatism is applied to the multipole.

A pole of a magnetic field which constitutes the multipole is separated into an inner side and an outer side, and a vacuum proof partition wall is formed between the inner poles and the outer poles, and a coil is wound around the outer poles.

A length of the pole on the inner side of the vacuum proof partition wall is set to a length 4 times or more as large as a diameter of a circle of a center portion through which an electronic beam passes so that the difference in Wien condition attributed to the difference in shape between the electric pole and the magnetic pole is reduced.

The direction of spin of an electron beam is deflected along an XY plane in the direction perpendicular to the advancing direction Z of the electron beam, and is deflected in the arbitrary direction in the XY plane.

The sample is a magnetic body sample or a topological insulating body.

Advantageous Effects of the Invention

According to the present invention, it is possible to realize the device which includes the first condenser lens, the spin rotator which includes the multipole capable of generating an electric field and a magnetic field, a Wien condition generating means and a second condenser lens, and can make an electron beam advance straightly and can rotate spin of the electronic beam in the arbitrary direction with the simple structure by making the direction of the electronic beam advance straightly and by rotating the spin of the electronic beam at a designated angle.

DESCRIPTION OF EMBODIMENTS

With respect to a Wien filter, there has been conventionally used a Wien filter of a type where an electric pole is inserted between electromagnets not shown in the drawing. In this case, however, the distribution of an electric field in a fringe portion and the distribution of a magnetic field in the fringe portion do not assume the same shape and hence, the deviation from the Wien condition inevitably occurs in the fringe portion even when a voltage and a current are adjusted so as to satisfy the Wien condition at a center portion. Accordingly, in 1986, a multipole Wien filter which uses 8 poles or 12 poles made of a conductive magnetic body was proposed as a Wien filter which can make the distribution of an electric field and the distribution of a magnetic field equal (non-patent literature 3).

In the case of the multipole, with respect to electric poles which form an electric field and magnetic poles which form a magnetic field respectively are constituted of the same 8 or 12 poles, the poles arranged in the X-axis direction are used as the electric poles, and the poles arranged in the Y-axis direction are used as the magnetic poles. Accordingly, the distribution of the electric field in a fringe field and the distribution of the magnetic field in a fringe field become approximately equal. A field in the diagonal direction functions both as electric poles and magnetic poles.

FIG. 1 shows an example of the Wien filter of the present invention.

FIG. 1(a) shows the whole structure of a dodecapole Wien filter. 12 wedge-shaped poles at the center portion of the Wien filter are poles (electric poles and magnetic poles) 1 forming a dodecapole. A vacuum vessel 2 is arranged outside the poles 1. The outside of the vacuum vessel 2 is constituted of magnetic poles 3 for forming a magnetic field, and a yoke 4 which magnetically connects the magnetic poles to each other. A coil not shown in the drawing is wound around each one of 12 magnetic poles 3.

FIG. 1(b) shows a 8-pole Wien filter. In this case, a coil not shown in the drawing is wound around respective poles 1 in the inside in a vacuum state. There may be a case where a cut may be formed in the vicinity of the wedge-shaped outer periphery of each pole 1 thus ensuring a large space for coil winding. When such a multipole Wien filter is used as a spin rotator in a plane which includes a Z axis, the direction that spin falls becomes the X-axis direction used as the electric field. An electronic beam whose spin is deflected advances straightly with a center axis thereof directed in the direction (Z axis) perpendicular to a surface of paper on which FIG. 1 (b) is drawn. Further, in FIG. 1(b), the vacuum vessel 2 shown in the drawing may be formed as a yoke (yoke having a plurality of poles 1) and the yoke 2 may be stored in the inside of the vacuum vessel not shown in the drawing.

FIG. 2 is an explanatory view for explaining the rotation of the spin in the present invention. The spin rotator shown in the drawing is the dodecapole Wien filter having the constitution shown in FIG. 1. FIG. 2 schematically shows the manner of the spin rotation in the inside of the Wien filter when the spin is adjusted (magnetic field and electric field being adjusted) such that the spin which is directed in the Z-axis direction (advancing direction of the electron beam) at the time of being incident from a left side has the direction thereof changed in the upward direction (see FIG. 2(a)) in one mode and in the lateral direction (see FIG. 2(b)) in the other mode in the XY plane (plane perpendicular to Z axis).

[Method of Rotating the Spin]

Next, for the sake of brevity, the explanation is made hereinafter with respect to a case where the octupole Wien filter shown in FIG. 1(b) is used. Electric poles which generate an electric field are the pole 4 and the pole 5 on a left side and the pole 1 and the pole 8 on a right side in FIG. 1(b). Assuming that the pole 5 and the pole 6 are used as electric poles in place of the pole 4 and the pole 5 and the pole 1 and the pole 2 are used as the electric poles in place of the pole 1 and the pole 8, and the pole 3 and the pole 4 are used as the magnetic poles in place of the pole 2 and the pole 3 and the pole 7 and the pole 8 are used in place of the pole 6 and the pole 7 as the magnetic poles, the direction which is rotated by 45° in the counterclockwise direction compared to the initial direction becomes the X axis, that is, the electric field direction. By rotating the spin using this Wien filter, the direction that the spin falls becomes the direction of 45° in plane. It is possible to make the spin fall in the direction which is further rotated by 45° by using the next poles in the same manner so that it is possible to eventually make the spin fall in the direction of 90° in plane.

Although it is understood that the spin can be made to fall in the direction toward a certain pole, it appears that the spin can be rotated only with a step of 45° in the case of the octupole shown in FIG. 1(b) and with a step of 30° in the case of the dodecapole shown in FIG. 1(a) and FIG. 2.

However, according to the present invention, the spin can be rotated to any angle, and this may be realized by adjusting a voltage or a current applied to the octupole or the dodecapole (further, multipole having poles integer times as large as poles of the quadrupole) in the following manner. That is, assuming 1 to 8 poles in FIG. 1(b) as n (namely, n=1, 2, 3 ... 8), the voltage and the current are expressed as follows.

$$V1(n)=V1\ \text{Cos}(\theta 0+n\theta+\alpha)$$

$$N1(n)=N1\ \text{Sin}(\theta 0+n\theta+\alpha)$$

Here, in the case of the octupole shown in FIG. 1(b), $\theta 0$ is 22.5°, $\theta$ is 45°, and n is 1 to 8. $\alpha$ is a target angle to be rotated. Although $\theta 0$ takes a value which is not zero when the electric pole 1 is disposed in a deviated manner from the horizontal direction as shown in FIG. 1(b), $\theta 0$ becomes zero ($\theta 0=0°$) when the electric pole 1 is disposed in the horizontal direction. The octupole takes the ordinary voltage arrangement without rotation when $\alpha$ is zero.

FIG. 3 is an explanatory view for explaining the rotation of the spin according to the present invention (No. 2). FIG. 3 shows voltage values obtained by calculation which are applied to the respective poles with respect to the case of the direction of 0° ($\theta=0°$) and the direction of 20° ($\theta=20°$) in the dodecapole. Here, FIG. 3 shows an example of voltages applied to the respective poles 1 to 12 when Vo is set to 100V (Vo=100V).

It is known that the voltage of the poles 2, 3, 6, 7 becomes ($\sqrt{2}-1$) times as large as the voltage of the poles 1, 4, 5, 8 in the case of the octupole filter. This is assumed as the X direction. The case where the voltage of the same value is imparted in the Y direction corresponds to the case where the direction of the field is rotated by 90°. To put together X and Y, the field is directed in the direction of synthesis of X and Y vectors, that is, in the direction of 45°.

FIG. 4 is an explanatory view of the rotation of the spin of the present invention (No. 3). FIG. 4 shows values obtained by a sine-cosine method when the direction of the field is rotated to the X direction, that is, 0° direction, when the direction of the field is rotated by 45° from the X direction, values obtained by the vector synthesis method described above when the spin is rotated to the X direction, the Y direction, and the direction of 45° obtained by putting both directions together, and values obtained by a vector product dividing the value of the direction of 45° by $\sqrt{2}$. It is understood that although the case where the direction of the field is rotated by 0° and the case where the direction of the field is rotated by 45° are shifted from each other by one stage in the sine-cosine method, also in the case of the vector synthesis method, the value obtained by multiplying a value which is obtained by adding up X and Y vectors to each other by $\sqrt{2}$ agree with the value obtained by shifting the value of the X direction by one stage. By changing a ratio between X and Y, the direction of the field can be rotated to an angle other than 45°. Such a method which changes the direction of a uniform field by the sum of the vectors has been conventionally used in generating a deflection field.

In this manner, the rotational direction of the spin can be set by either one of the sine-cosine method and the vector addition method.

FIG. 5 is an explanatory view for explaining the rotation of the spin of the present invention (No. 4). FIG. 5 shows an example of the direction of an electric field and the direction of a magnetic field in the present invention. FIG. 5 shows the case where the direction of the electric field and the direction of a magnetic field are rotated for rotating the spin of the electron beam by 0°, 20° and 40° in the case of the dodecapole. In this manner, the rotation of the spin by an angle smaller than the interval between the poles can be also performed without any problem. By rotating the direction of an electric field and the direction of a magnetic field applied to an electron beam with the use of the multipole Wien filter, the spin can be rotated by an angle equal to a rotational angle of an electric field where the spin is made to fall and can be made to advance straightly as described later.

Next, in the case of the 90° deflector, it is apparent that the spin which is directed in the direction parallel to an optical axis is directed in the direction perpendicular to the optical axis when an electron beam is deflected by 90° using only an electric field. In the case of the Wien filter, while a spin rotational angle can be obtained by the formula based on Larmor precession explained previously, the relationship between the spin rotational angle and focusing of the electron beam can be understood as follows.

Although the electron beam advances straightly in the Wien filter, this only means that the rotational movement generated by a magnetic field is made to return to the beam axis by an electric field. Accordingly, the rotation of the spin can be estimated based on the relationship between a deflection angle generated by a magnetic field and the focusing condition of the electron beam. It has been known that a rotational angle which is necessary for focusing the electron beam by a magnetic field deflector under one-way focusing where only focusing in the X direction is performed and focusing in the Y direction is not performed is 180°. Accordingly, it is understood that when an ampere turn is adjusted such that the electron beam is incident on the Wien filter parallel to the filter so that the electron beam is focused at an exit of the filter, this adjustment is the condition for rotating the spin by 90°.

[Drawback that Uniform Field Wien Filter has and Addition of Quadrupole Field]

Heretofore, the case where the Wien filter in which a uniform electric field EI and a uniform magnetic field BI are applied to an electron beam has been explained. To depict the trajectories of an electron beam with respect to an XZ plane and a YZ plane in this case, they are shown in FIG. 6(a) and FIG. 6(b) respectively. Assume that the electron beam is controlled by an external lens system such that the electron beam is focused on a center plane of the Wien filter when the Wien filter is turned off. Here, on the XZ plane, the focusing position is moved to the left from the center of the filter due to a lens action of the Wien filter. However, in the ZY plane shown in FIG. 6(b), there is no lens action in the Y direction (direction of magnetic field) and hence, the electron beam exhibits the same trajectory as in the case where the Wien filter is turned off. That is, the lens condition differs between in the X direction and in the Y direction. Although this influence appears not so serious so long as FIG. 6 is observed, it is understood that the difference in focusing is serious when beam shapes shown in FIG. 7 are viewed. FIG. 7(a) shows the beam shape at a position where the electron beam is discharged from the filter by 80 mm (Z=80 mm), and FIG. 7(b) shows the beam shape at the center of the filter (Z=0 mm). The beam shape exhibits an elliptical shape after the electron beam is discharged from the filter. At Z=0, the electron beam is incident such that a size of the electron beam becomes 0 in the Y direction when there is no filter and hence, the size of the electron beam substantially becomes 0. When the electron beam becomes an electron beam having such strong astigmatism, it is difficult to use the Wien filter in an irradiation optical system for irradiating a sample and hence, it is necessary to remove the astigmatism in the post optical system.

In view of the above, there is provided the following method where an electron beam having no astigmatism is formed by imparting a focusing action to the electron beam in the Y direction by adding a quadrupole electric field to the Wien filter per se. The following formula is a calculation formula for obtaining a quadrupole electric field for forming an electron beam having no astigmatism, and a formula for obtaining a uniform field is also described together with the formula. $V(n)=V1(n)+V2(n)$, $Ni(n)$ respectively indicate a voltage and a current which are applied to the n-th pole and the number of turns of coil multiplied to the current.

$$E2=-E1/4R \quad (1)$$

$$R=L/(2)1/2\pi \quad (2)$$

$$E1=(2)3/2\pi U0/L \quad (3)$$

$$E2=\pi 2U0/L2 \quad (4)$$

$$V1=rE1 \quad (5)$$

$$V2=r2E2 \quad (6)$$

$$V(n)=V1(n)+V2(n) \quad (7)$$

$$V1(n)=V1\ \cos(\theta+\alpha) \quad (8)$$

$$V2(n)=V2\ \cos(2(\theta+\alpha)) \quad (9)$$

$$E2=2(1+1/(2)1/2)\pi U0/L \quad (10)$$

$$Bl=El/v \quad (11)$$

$$NT=C1B1s/(\mu\pi). \quad (12)$$

$$NT(n)=NT\ \sin(\theta+\alpha) \quad (13)$$

By overlapping the quadrupole electric field in this manner, focusing is performed in the Y direction and hence, astigmatism in the electron beam which is discharged from the spin rotator can be removed. FIG. 8(a) shows the beam shape at a position where the electron beam is discharged from the filter by 80 mm (Z=80 mm), and FIG. 8(b) shows the beam shape at the center of the filter (Z=0 mm). FIG. 9 shows a trajectory of an electron on a ZX plane and a trajectory of an electron on a ZY plane. In this case, in an actual operation, the voltage V(n) is expressed as $V(n)=V1(n)+CV2(n)$ where V2(n) is multiplied by a coefficient C. In FIG. 8, C is set to 0.875 (C=0.875). The reason the actual value is smaller than the value of quadrupole electric field obtained by calculation is attributed to an action of a fringe field.

In the above-mentioned explanation, it is explained that there is no focusing in the Y direction when a uniform field is used. In an actual operation, there is a small focusing action in the Y direction. This is an action brought about by a fringe field, and it is known that the fringe field has a round lens action. Accordingly, a lens action amounting to 12.5% has been already present in the Y direction. In an actual operation, the shorter a length of the filter, the larger an action of a round lens becomes in ratio and hence, the value of this coefficient becomes smaller.

FIG. 10 is an explanatory view of the rotation of the spin according to the present invention (No. 9). FIG. 10 shows an irradiation lens system which includes: an incident lens which is arranged on a preceding stage of a Wien-type omnidirectional spin rotator (lens for focusing at the center of the rotator (center of the lens)); and a condenser lens (lens for focusing the center of the rotator (center of the lens) at a surface of a sample to be irradiated or the like) on a succeeding stage of the spin rotator. Although the condenser lens in the succeeding stage is shown in one stage, it is possible to provide an irradiation lens system which can control a wider irradiation area by increasing the condenser lens by one more stage.

In performing focusing with no astigmatism by adding a quadrupole electric field, the quadrupole electric field is added so as to impart a focusing action in the Y direction to the electron beam. However, the quadrupole has a diverging action in the direction (X) opposite to the focusing direction (Y). Accordingly, as can be understood from the above-mentioned formula, a focusing ampere turn is increased by $\sqrt{(2)}$ times. In this case, the influence exerted on a spin rotational angle by the increase of the focusing ampere turn is considered. In the case of a magnetic field deflector, a rotational angle at which focusing is performed with no astigmatism is increased to 254°. Accordingly, to find a condition under which the spin is rotated by 90°, it is necessary to find a condition under which focusing is performed with parallel beam incidence in a state where a quadrupole electric field is not applied to the electron beam.

Next, the matters necessary for an actual device are explained.

[Countermeasure to Cope with Ultrahigh Vacuum]

FIG. 11 is an explanatory view of the rotation of the spin according to the present invention (No. 10). FIG. 11 shows an example of the Wien filter according to the present invention. The Wien filter which is used as a spin rotator is often used in an ultrahigh vacuum and hence, as explained in conjunction with FIG. 1, it is necessary to arrange coils for generating a magnetic field outside the vacuum. The example shown in FIG. 11 adopts the structure where respective poles are divided into inner poles and outer poles, and a pipe (non-magnetic) which constitutes a vacuum vessel 2 is interposed between the inner poles and the outer poles. As a matter of course, it is necessary that an insulator is provided between the respective inner poles 1 and the vacuum pipe so that the respective inner poles 1 are electrically insulated from each other. A drawback that this structure has is that the vacuum vessel is made of metal and hence, although a multipole electric field is formed only inside the vacuum vessel, a magnetic coil is wound around poles 3 outside the vacuum pipe so that a multipole magnetic field extends to the outside of the vacuum vessel whereby a length of respective poles which constitute the electric field and a length of respective poles which constitute the magnetic field differ from each other. Inventors of the present invention, however, have found that the difference in length between the electric poles and the magnetic poles causes no problem practically by allowing the vacuum vessel to have a length 4 times as large as a diameter of a space or a gap where the electric field or the magnetic field is generated.

FIG. 6(a) and FIG. 9(a) are views showing a trajectory of an electron on an XZ plane. When the Wien condition is not established due to the difference in shape between the electric pole and the magnetic pole, the trajectory is bent at a middle portion thereof thus not forming a straight optical axis. However, as shown in these drawings, the optical axis is held straight and hence, it is found that the problem caused by the difference in length between the electric poles and the magnetic poles is overcome.

[Case where the Direction of the Spin of an Electron Beam is in a Plane Perpendicular to the Advancing Direction of the Electron Beam in an Initial State]

The explanation has been made heretofore with respect to the device where an electron beam having the spin whose direction is set parallel to the advancing direction Z of the electron beam is deflected by 90°, and the direction along which the spin is made to fall in an XY plane perpendicular to the beam advancing direction at this point of time can be freely selected.

However, the discharge of spin polarized electron in a vacuum is not limited to such a case, and there may be a case where an electron beam which is directed in the specific direction in an XY plane is discharged. In such a case, the rotation of the spin where the direction of the spin is directed in the Z direction may be performed by deflecting the electron beam by 90° by the above-mentioned method. In this case, it is unnecessary to take into account an angle in the XY plane so that any value can be designated as an angle in the XY plane.

Considered here is a case where, in a state where the spin is directed in an XY plane, the spin is rotated in the XY plane in the direction which differs from the initial direction of the spin. In this case, the rotation of the spin is set such that the spin is rotated by a value twice as large as the value in the above-mentioned electric field or magnetic field where the spin is rotated by 90°, that is, the spin is rotated by 180°. The electric field and the magnetic field formed of an octupole respectively are set such that an angle of the spin in the XY plane corresponds to an example of an angle at which the spin is finally directed. Due to such a constitution, the spin is rotated by 90° so as to be directed in the Z direction in the first half rotation. Then, in the latter half rotation, the spin is directed again in the ZY plane from the above-mentioned Z direction. In this case, the angle in the XY plane is directed in the direction of the designated angle.

In this manner, by setting the rotation of 90° when the initial direction of the spin is in the Z direction, and by setting the rotation of 180° when the initial direction of the spin is in the XY plane, the device of the present invention copes with both cases. As a matter of course, in the case of an angle between both cases, an intermediate value is set. Accordingly, the device of the present invention can cope with the spin directed in any direction.

BRIEF DESCRIPTION OF DRAWINGS

FIG. 2 An explanatory view of the rotation of the spin of the present invention (No. 1).

FIG. 4 An explanatory view of the rotation of the spin of the present invention (No. 3).

FIG. 8 An explanatory view of the rotation of the spin of the present invention (No. 7).

FIG. 13 An explanatory view of prior art (No. 2).

REFERENCE SIGNS LIST

Figure 1:
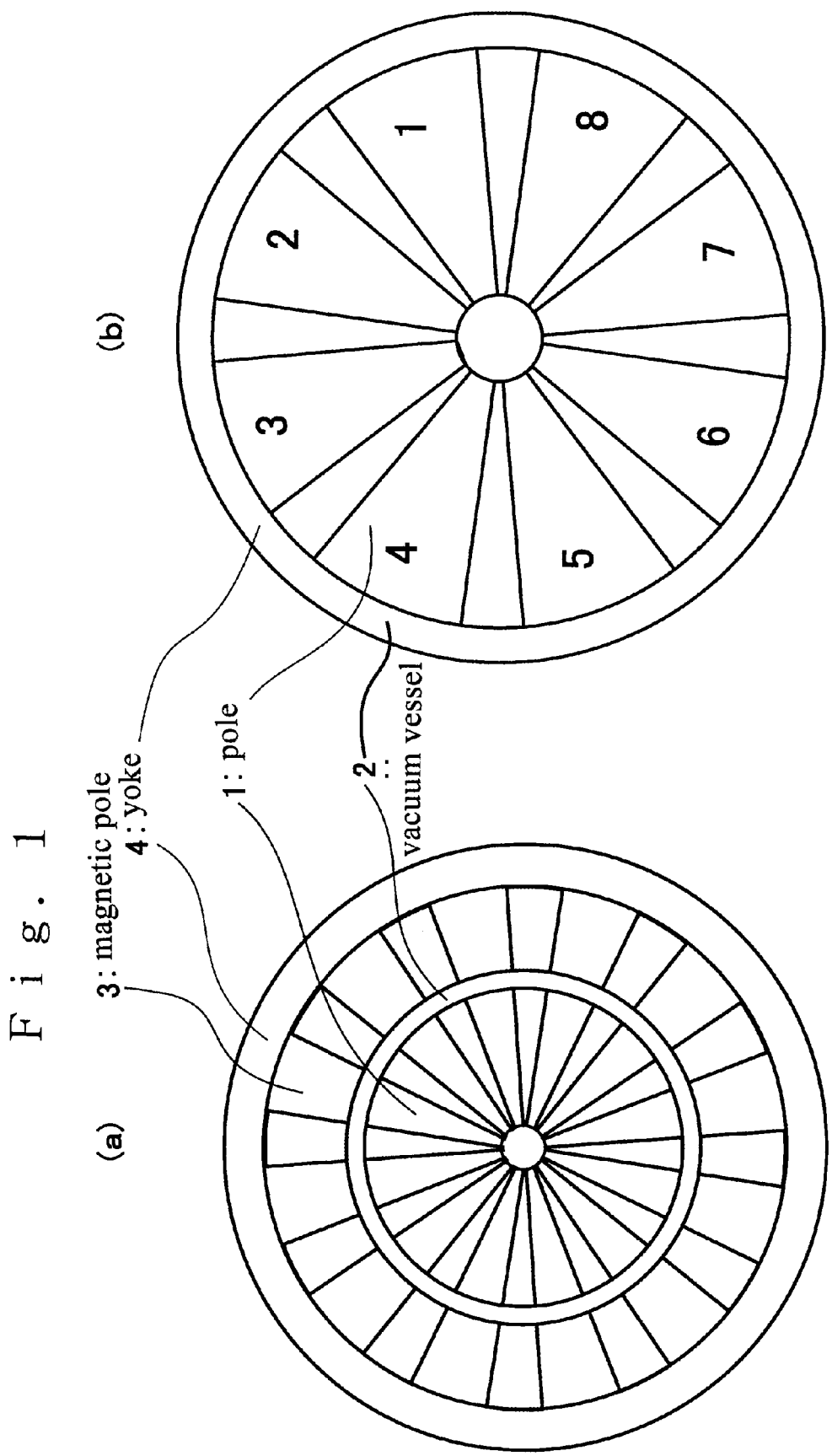
FIG. 1 An example of a Wien filter of the present invention.
Figure 3:
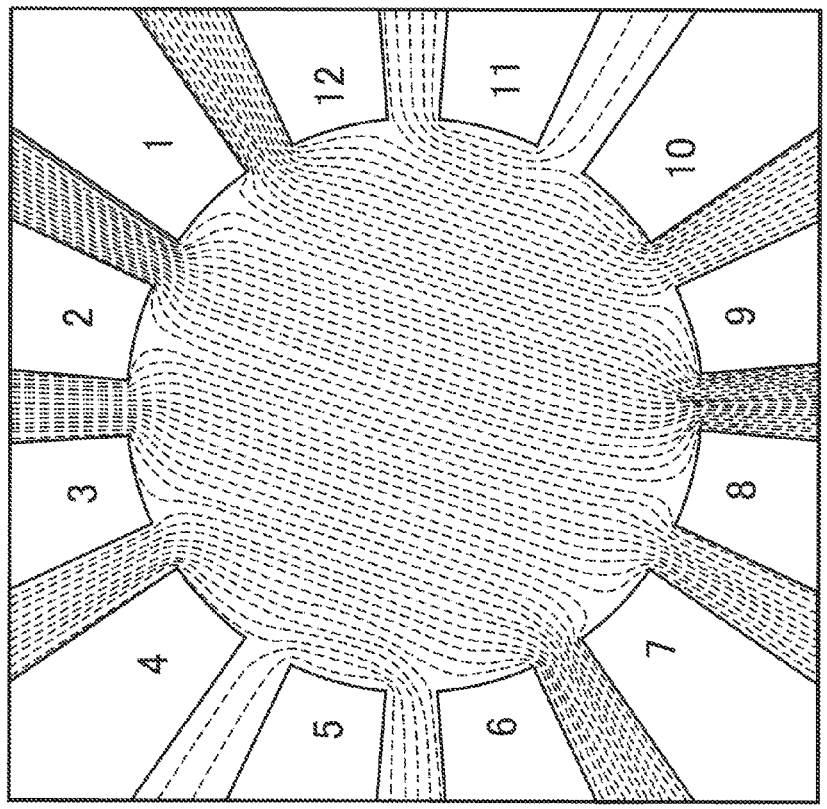
FIG. 3 An explanatory view of the rotation of the spin of the present invention (No. 2).
Figure 5:
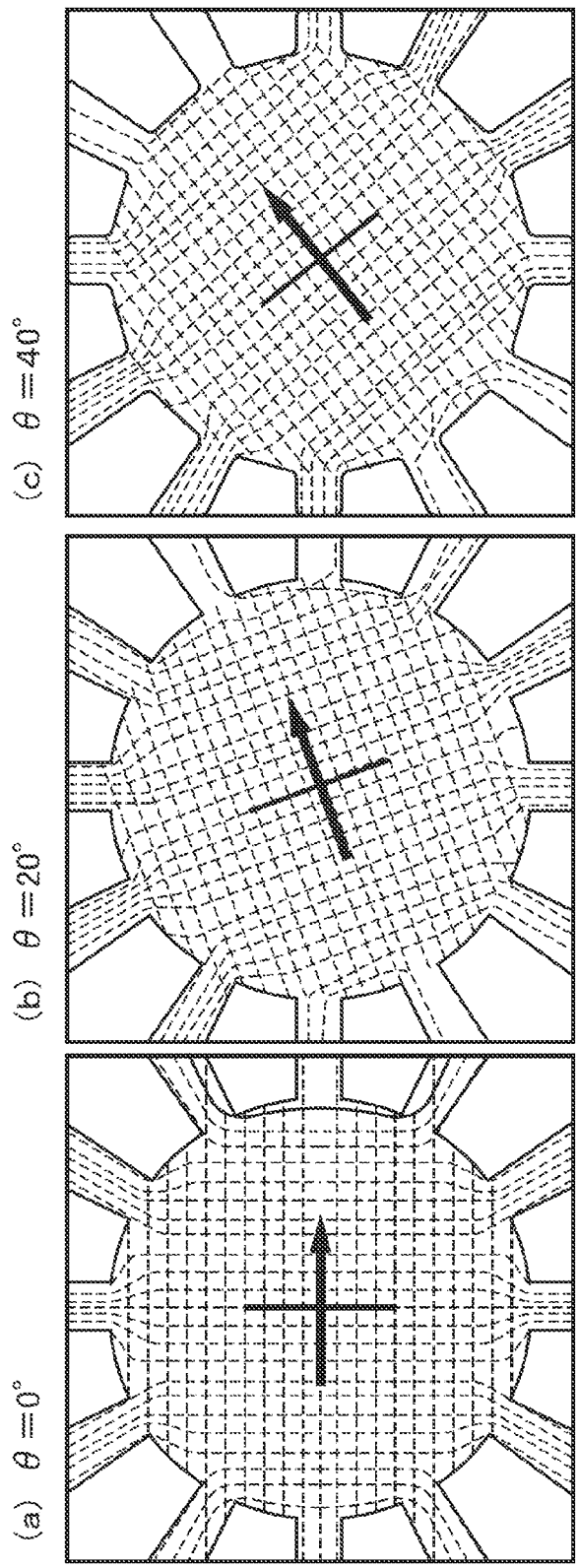
FIG. 5 An explanatory view of the rotation of the spin of the present invention (No. 4).
Figure 6:
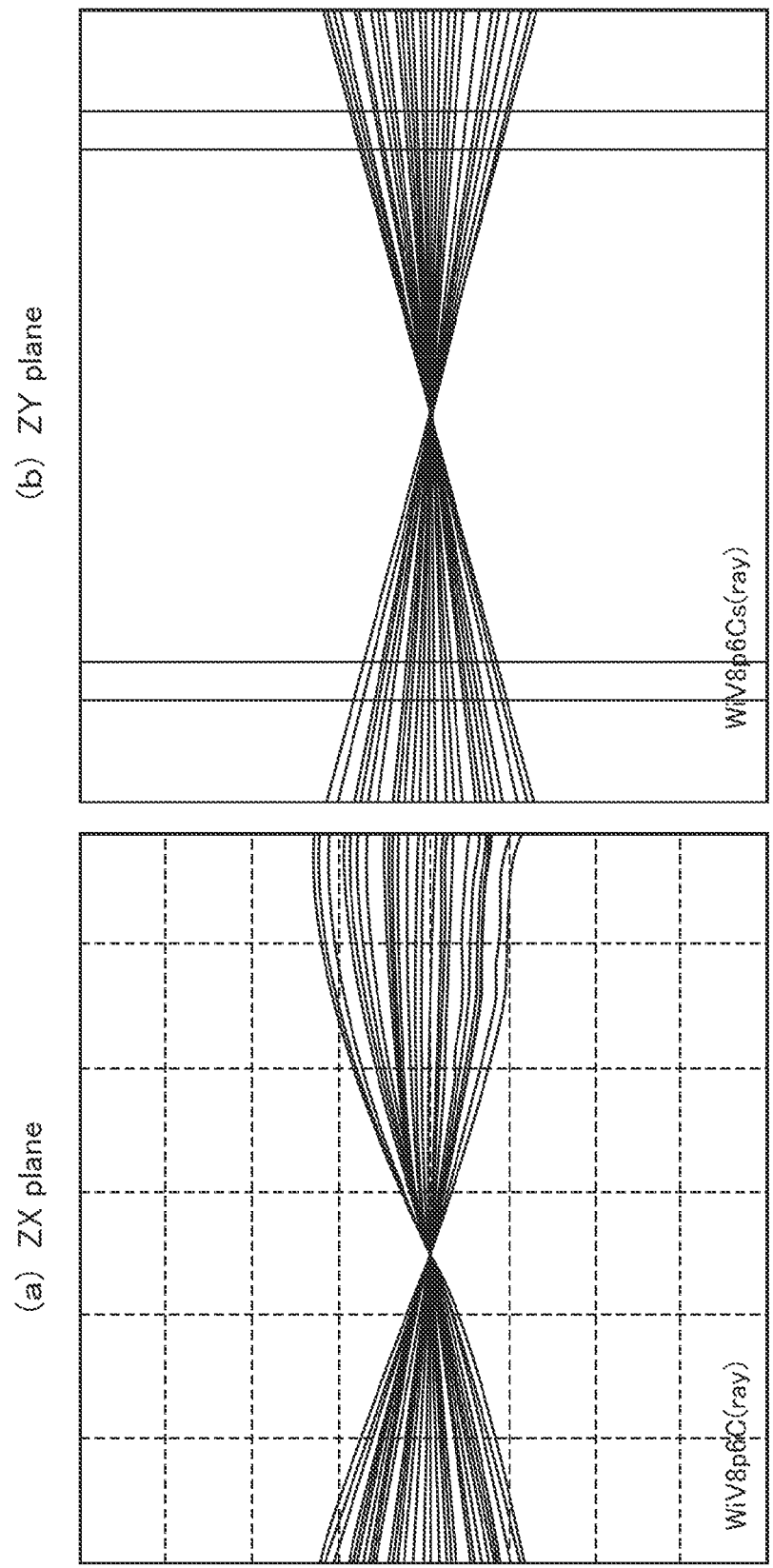
FIG. 6 An explanatory view of the rotation of the spin of the present invention (No. 5).
Figure 7:
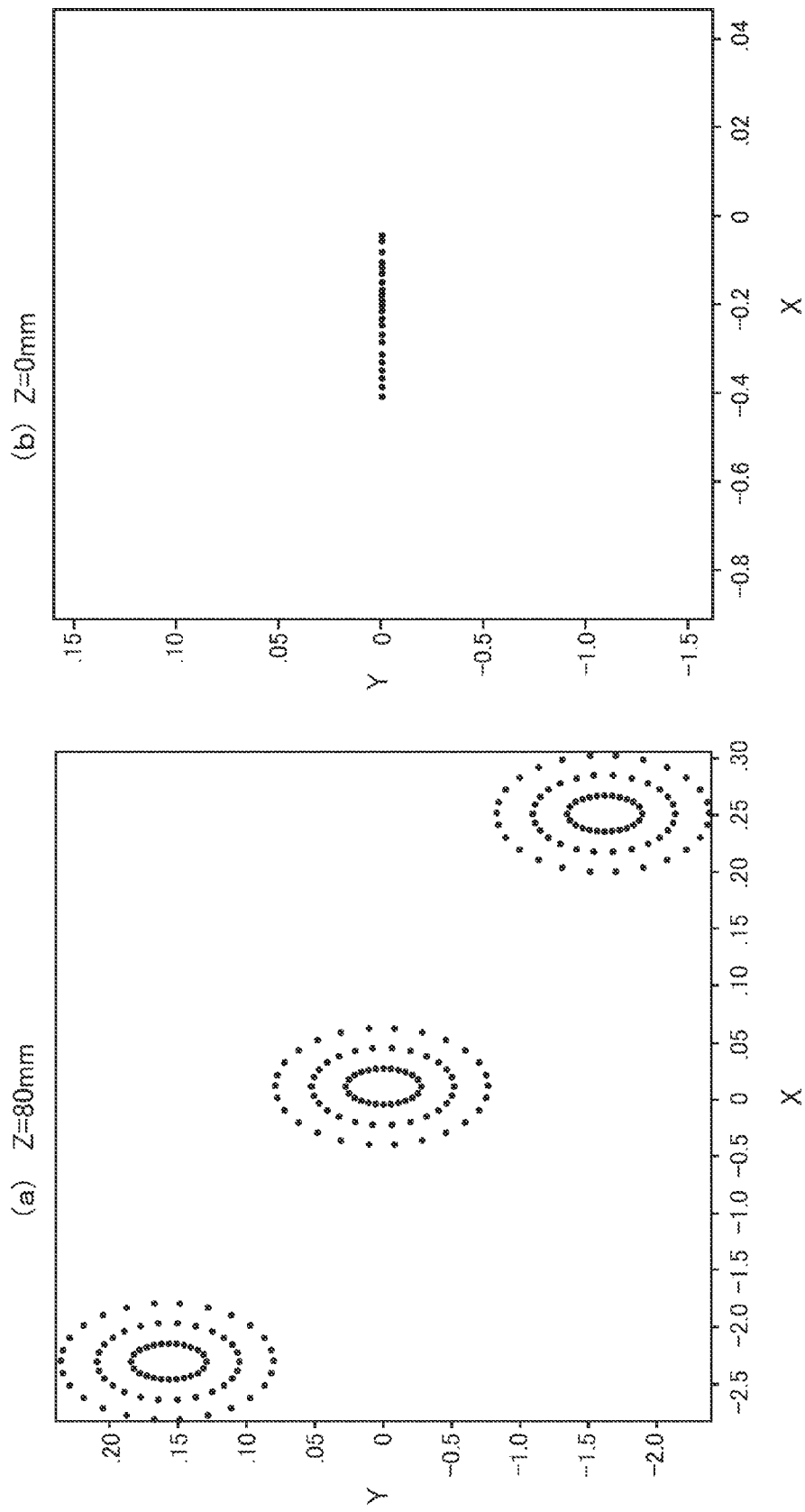
FIG. 7 An explanatory view of the rotation of the spin of the present invention (No. 6).
Figure 9:
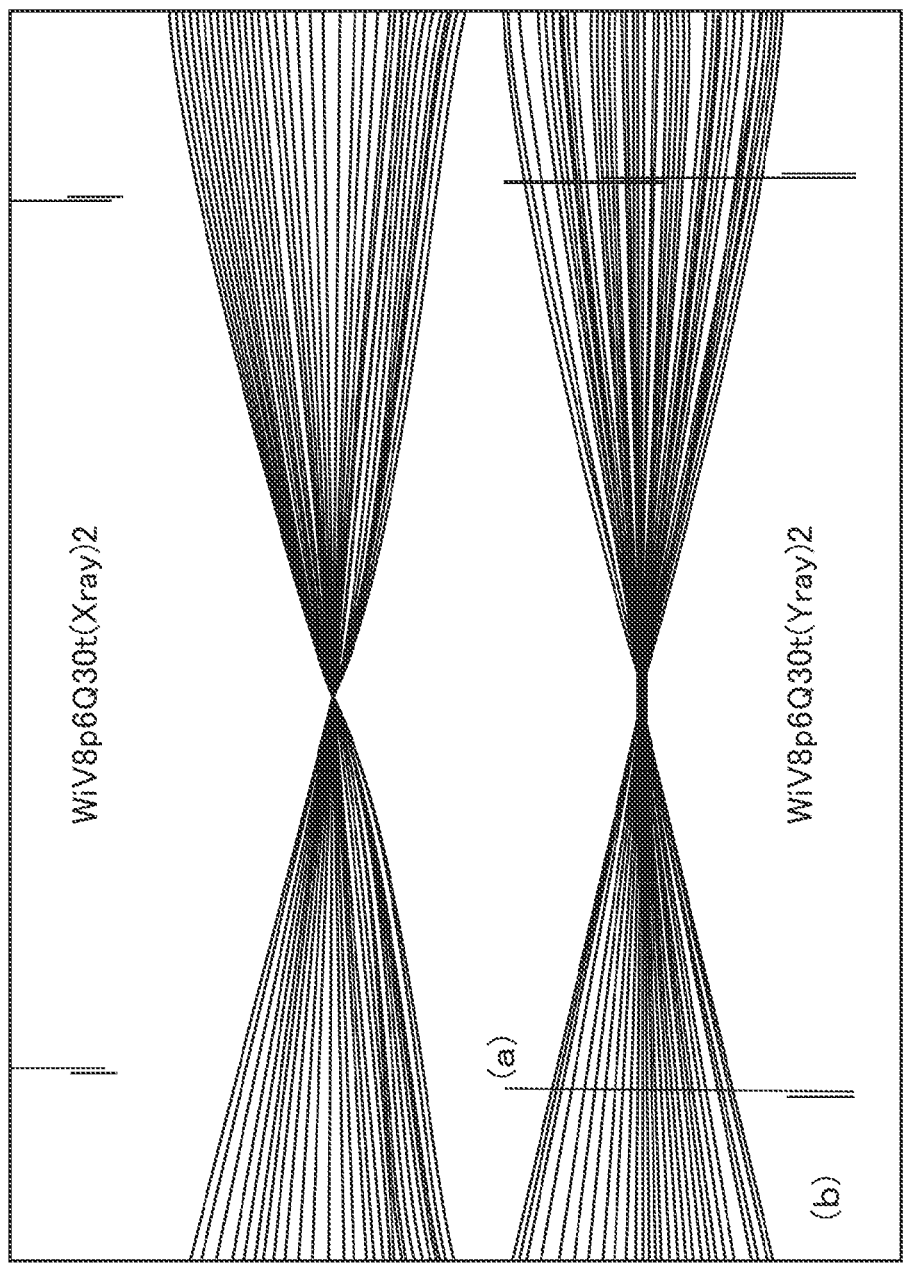
FIG. 9 An explanatory view of the rotation of the spin of the present invention (No. 8).
Figure 10:
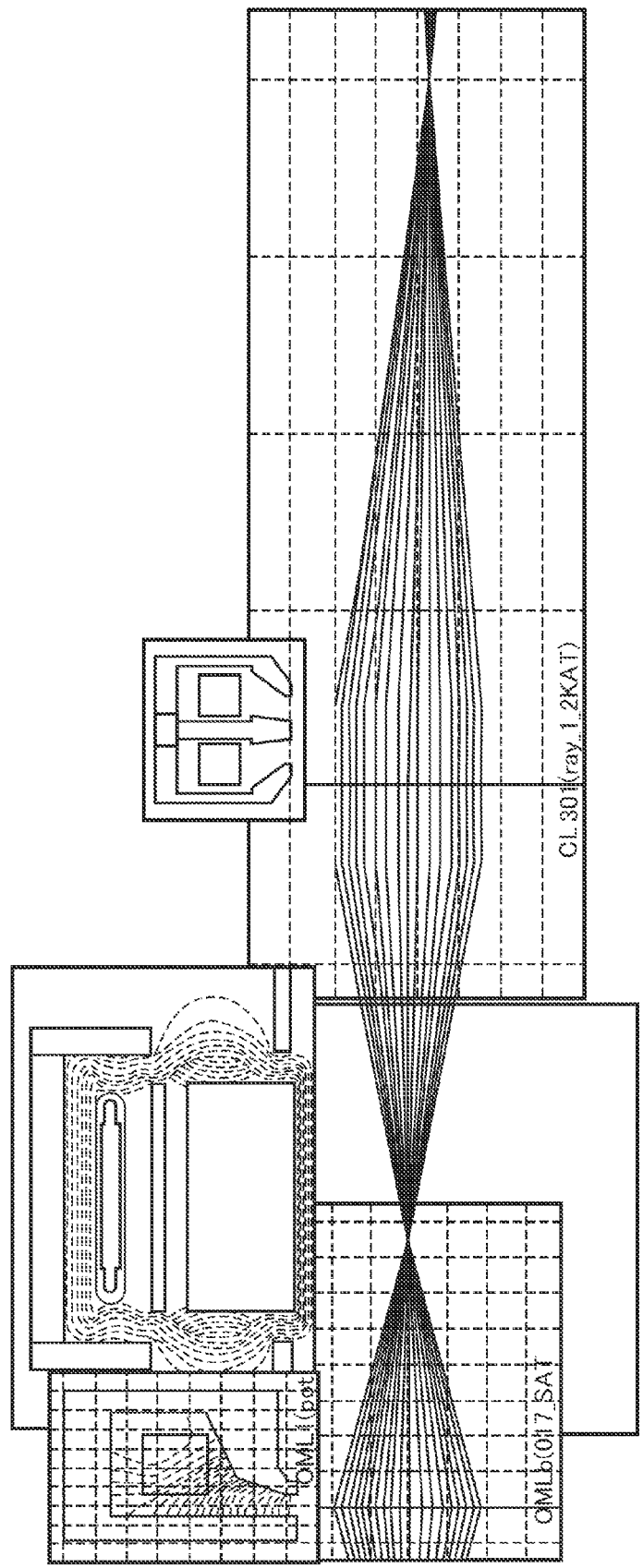
FIG. 10 An explanatory view of the rotation of the spin of the present invention (No. 9).
Figure 11:
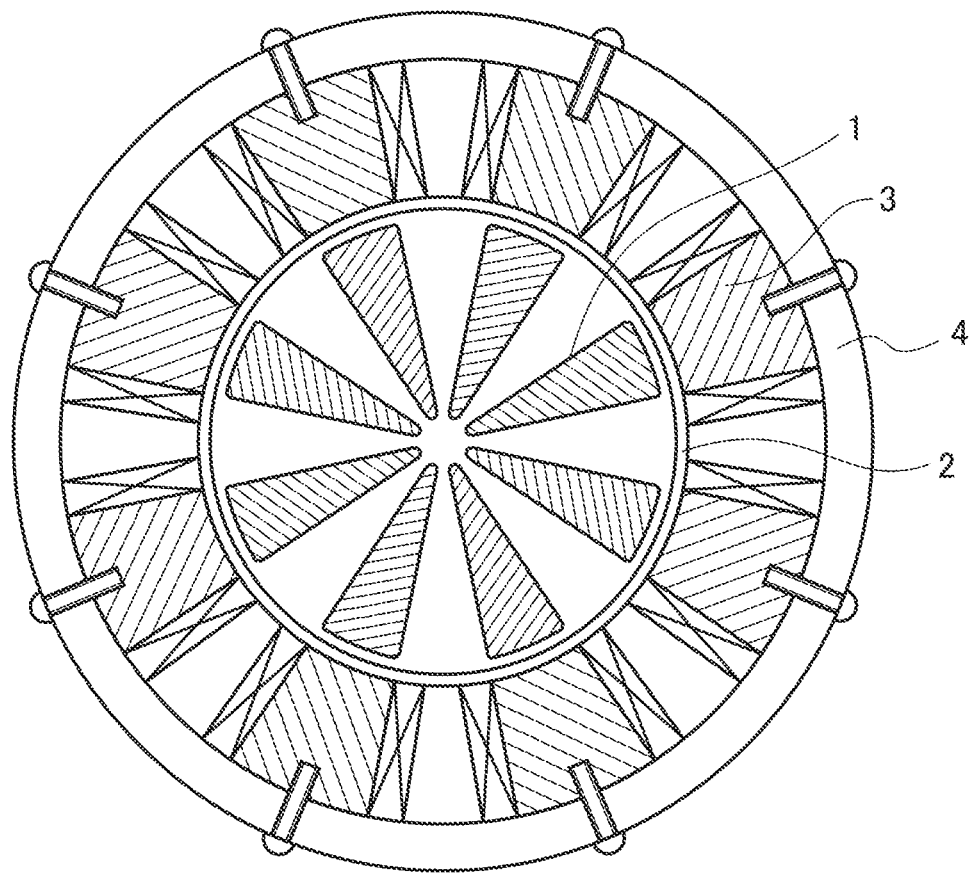
FIG. 11 An explanatory view of the rotation of the spin of the present invention (No. 10).
Figure 12:
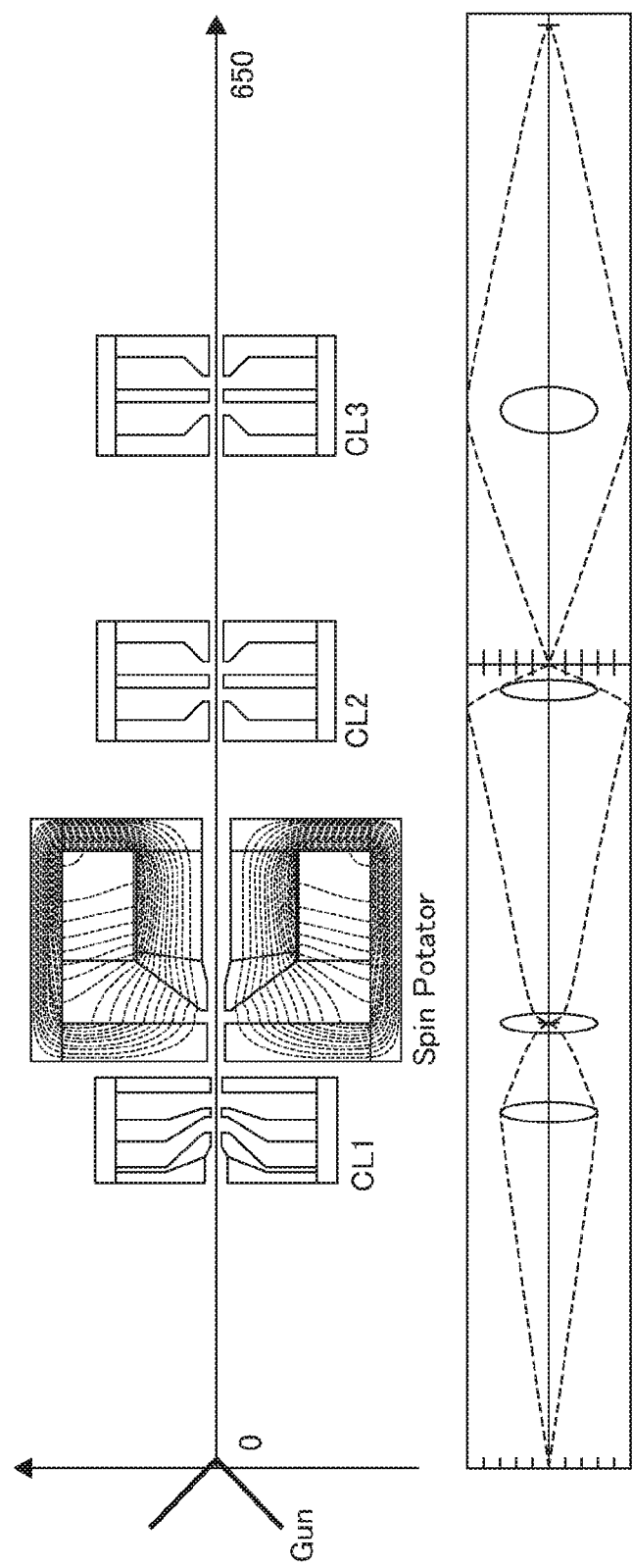
FIG. 12 An explanatory view of prior art (No. 1).
Figure 14:
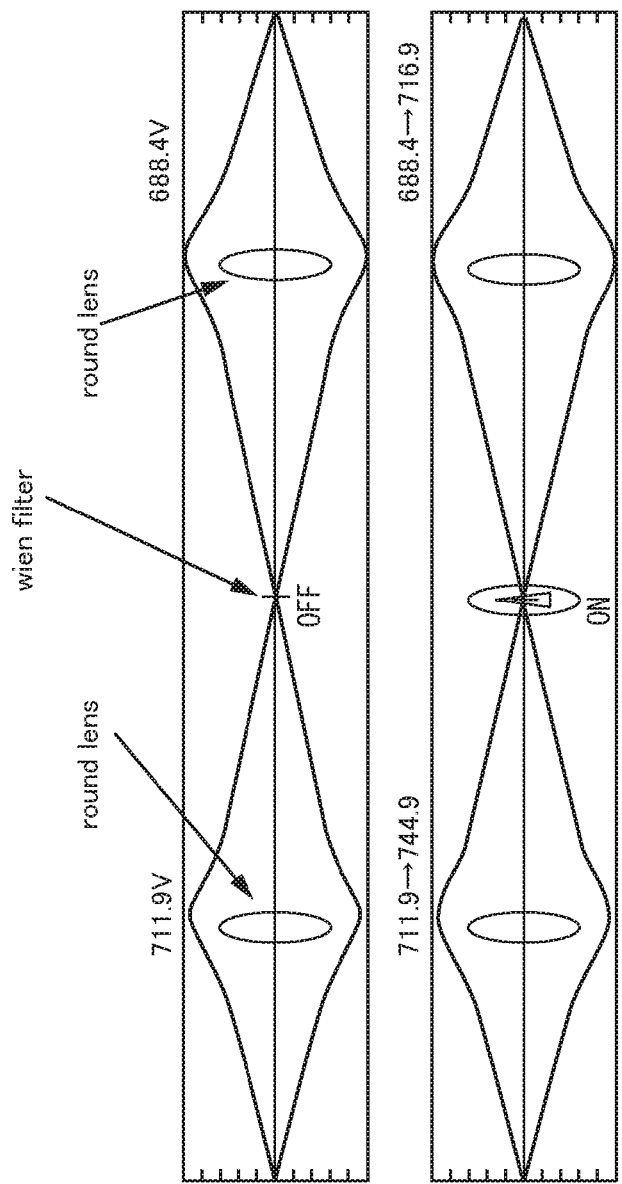
FIG. 14 An explanatory view of prior art (No. 3).
Figure 15:
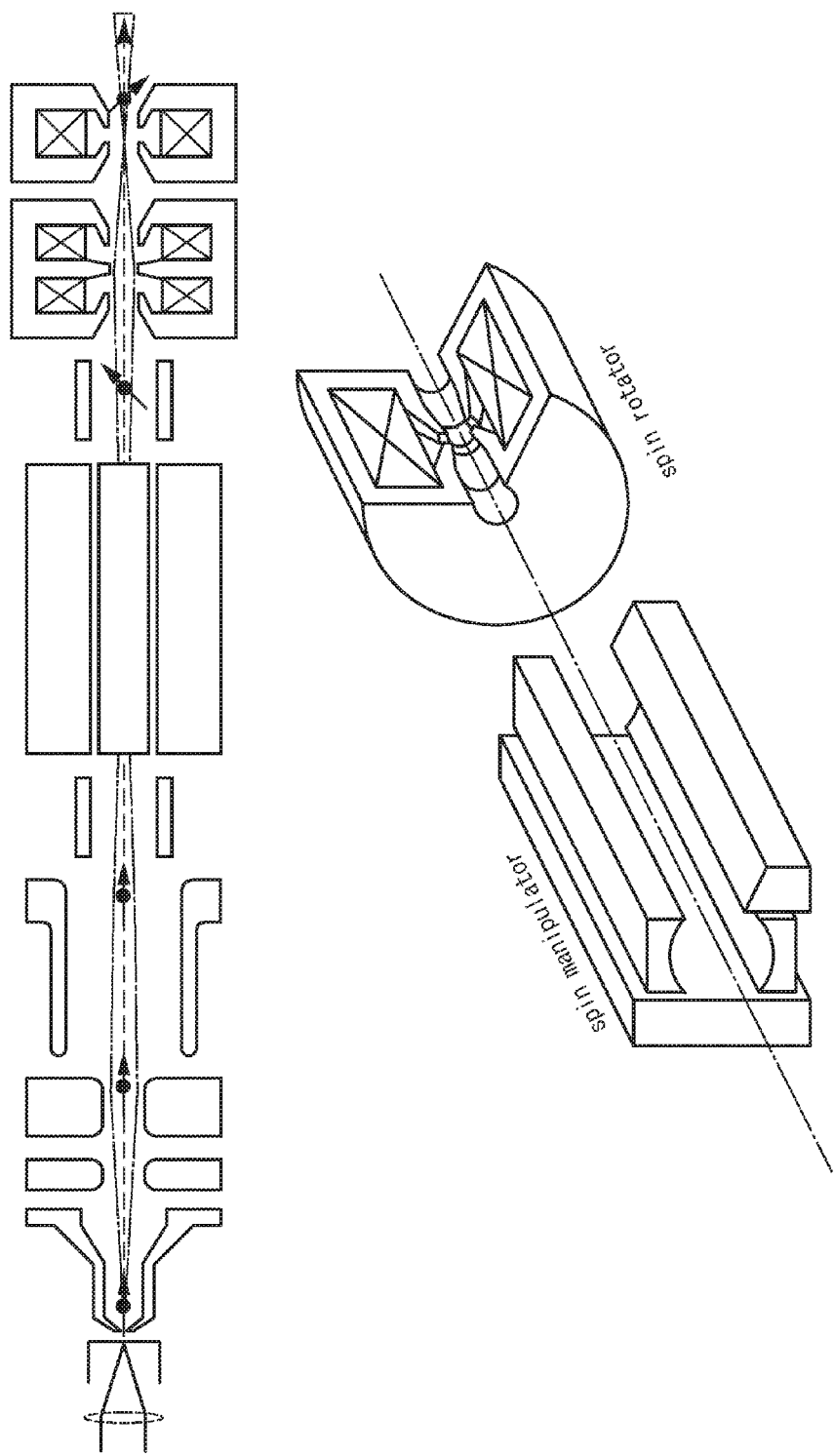
FIG. 15 An explanatory view of prior art (No. 4).
Figure 16:
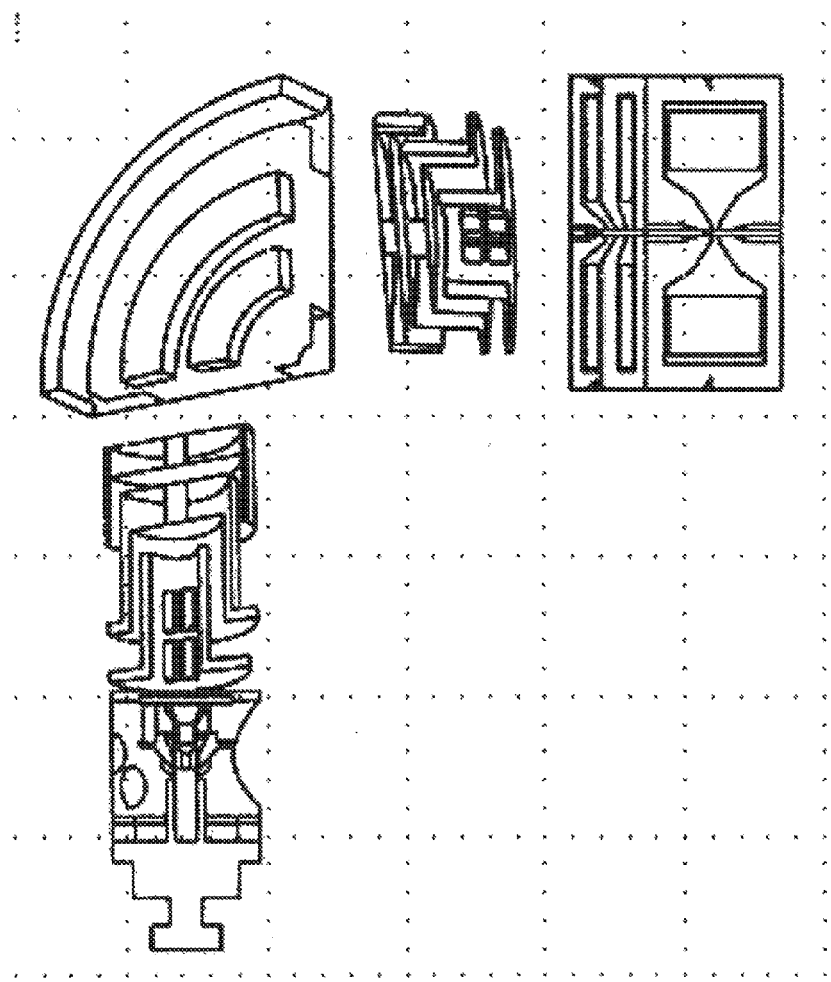
FIG. 16 An explanatory view of prior art (No. 5).

1: pole (electric pole/magnetic pole)
2: vacuum vessel (yoke)
3: magnetic pole
4: yoke

The invention claimed is:

1. A spin rotation device which is configured to rotate a spin polarized electron beam which is discharged from an electron gun or is discharged from, is reflected on or is made to pass through a sample in the desired direction, the spin rotation device comprising:
   a first condenser lens which focuses the spin polarized electron beam which is discharged from the electron gun or is discharged from or is reflected on the sample;
   a spin rotator which includes a multipole that consists of poles of a multiple of four excluding four, having a point on which the electron beam is focused by the first condenser lens at a lens center or in the vicinity of the lens center and being capable of generating an electric field and a magnetic field;
   a voltage and current generating means which generates a voltage and a current expressed by following formulae which satisfy the Wien condition for rotating spin of the electron beam by a designated angle and making the electron beam advance straightly to the multipole which constitutes the spin rotator; and
   a second condenser lens which focuses the electron beam whose spin is rotated by the spin rotator $$V1(n)=V1\ \text{Cos}(\theta 0+n\theta+\alpha)$$

$$N1(n)=N1\ \text{Sin}(\theta 0+n\theta+\alpha)$$

here, n is the number of the pole, V1(n) and N1(n) are a voltage and a current of an n-th pole, V1 and N1 are a voltage and a current of a uniform field which satisfies the Wien condition, θ0 is an angle of the first pole from the horizontal direction, θ is an angle determined based on the number of poles of the multipole and is obtained as 360°/number of poles, and a indicates the rotating angle of the spin.

2. The spin rotation device according to claim 1, wherein at least one of a quadrupole electric field and a quadrupole magnetic field which corrects astigmatism is applied to the multipole.

3. The spin rotation device according to claim 2, wherein a pole of a magnetic field which constitutes the multipole is separated into an inner side and an outer side, and a vacuum proof partition wall is formed between the inner poles and the outer poles, and a coil is wound around the outer poles.

4. The spin rotation device according to claim 3, wherein a length of the pole on the inner side of the vacuum proof partition wall is set to a length four times or more as large as a diameter of a circle of a center portion through which an electronic beam passes so that the difference in Wien condition attributed to the difference in shape between the electric pole and the magnetic pole is reduced.

5. The spin rotation device according to claim 3, wherein the rotating angle of spin of an electron beam is deflected along an XY plane in the direction perpendicular to the advancing direction Z of the electron beam, and is deflected in the arbitrary direction in the XY plane.

6. The spin rotation device according to claim 2, wherein the rotating angle of spin of an electron beam is deflected along an XY plane in the direction perpendicular to the advancing direction Z of the electron beam, and is deflected in the arbitrary direction in the XY plane.

7. The spin rotation device according to claim 1, wherein a pole of a magnetic field which constitutes the multipole is separated into an inner side and an outer side, and a vacuum proof partition wall is formed between the inner poles and the outer poles, and a coil is wound around the outer poles.

8. The spin rotation device according to claim 7, wherein a length of the pole on the inner side of the vacuum proof partition wall is set to a length four times or more as large as a diameter of a circle of a center portion through which an electronic beam passes so that the difference in Wien condition attributed to the difference in shape between the electric pole and the magnetic pole is reduced.

9. The spin rotation device according to claim 7, wherein the rotating angle of spin of an electron beam is deflected along an XY plane in the direction perpendicular to the advancing direction Z of the electron beam, and is deflected in the arbitrary direction in the XY plane.

10. The spin rotation device according to claim 1, wherein the rotating angle of spin of an electron beam is deflected along an XY plane in the direction perpendicular to the advancing direction Z of the electron beam, and is deflected in the arbitrary direction in the XY plane.

11. The spin rotation device according to claim 1, wherein the sample is a magnetic body sample or a topological insulating body.

12. The spin rotation device according to claim 1, wherein at least one of a quadrupole electric field and a quadrupole magnetic field which corrects astigmatism is applied to the multipole.

13. The spin rotation device according to claim 12, wherein a pole of a magnetic field which constitutes the multipole is separated into an inner side and an outer side, and a vacuum proof partition wall is formed between the inner poles and the outer poles, and a coil is wound around the outer poles.

14. The spin rotation device according to claim 13, wherein a length of the pole on the inner side of the vacuum proof partition wall is set to a length four times or more as large as a diameter of a circle of a center portion through which an electronic beam passes so that the difference in Wien condition attributed to the difference in shape between the electric pole and the magnetic pole is reduced.

15. The spin rotation device according to claim 13, wherein the rotating angle of spin of an electron beam is deflected along an XY plane in the direction perpendicular to the advancing direction Z of the electron beam, and is deflected in the arbitrary direction in the XY plane.

16. The spin rotation device according to claim 12, wherein the rotating angle of spin of an electron beam is deflected along an XY plane in the direction perpendicular to the advancing direction Z of the electron beam, and is deflected in the arbitrary direction in the XY plane.

17. The spin rotation device according to claim 1, wherein a pole of a magnetic field which constitutes the multipole is separated into an inner side and an outer side, and a vacuum proof partition wall is formed between the inner poles and the outer poles, and a coil is wound around the outer poles.

18. The spin rotation device according to claim 17, wherein a length of the pole on the inner side of the vacuum proof partition wall is set to a length four times or more as large as a diameter of a circle of a center portion through which an electronic beam passes so that the difference in Wien condition attributed to the difference in shape between the electric pole and the magnetic pole is reduced.

19. The spin rotation device according to claim 17, wherein the rotating angle of spin of an electron beam is deflected along an XY plane in the direction perpendicular to the advancing direction Z of the electron beam, and is deflected in the arbitrary direction in the XY plane.

20. The spin rotation device according to claim 1, wherein the rotating angle of spin of an electron beam is deflected along an XY plane in the direction perpendicular to the advancing direction Z of the electron beam, and is deflected in the arbitrary direction in the XY plane.

21. The spin rotation device according to claim 1, wherein the sample is a magnetic body sample or a topological insulating body.

* * * * *